United States Patent [19]
Kobayashi et al.

[11] Patent Number: 5,808,523
[45] Date of Patent: Sep. 15, 1998

[54] HIGH FREQUENCY FILTER INCLUDING BOTH DIELECTRIC AND SURFACE ACOUSTIC WAVE RESONATORS

[75] Inventors: Yasumi Kobayashi; Kuniyuki Matsui; Yasuhiro Hirao; Kousuke Takeuchi, all of Osaka-fu; Kenichi Shibata, Wakayama-ken, all of Japan

[73] Assignee: Sanyo Electric Co., Ltd., Moriguchi, Japan

[21] Appl. No.: 963,117

[22] Filed: Oct. 28, 1997

Related U.S. Application Data

[63] Continuation of Ser. No. 626,909, Apr. 4, 1996, abandoned, which is a continuation of Ser. No. 357,205, Dec. 13, 1994, abandoned.

[30] Foreign Application Priority Data

Dec. 17, 1993 [JP] Japan .................................. 5-318128

[51] Int. Cl.⁶ .............................. H03H 9/64; H01P 1/202
[52] U.S. Cl. ............................................ 333/193; 333/202
[58] Field of Search ..................................... 333/126, 129, 333/132, 135, 193, 202, 133; 370/38, 123

[56] References Cited

U.S. PATENT DOCUMENTS

| | | | |
|---|---|---|---|
| 4,509,165 | 4/1985 | Tamura | 370/38 |
| 5,254,962 | 10/1993 | Morris et al. | 333/193 |
| 5,467,065 | 11/1995 | Turunen et al. | 333/132 |

FOREIGN PATENT DOCUMENTS 0 541 284   10/1992   European Pat. Off. .

OTHER PUBLICATIONS

Robert C. Smythe, *Crystal Filters, Miniaturized and Integrated Filters*, 1989, pp. 281–287.

*Primary Examiner*—Benny Lee
*Assistant Examiner*—David H. Vu
*Attorney, Agent, or Firm*—Armstrong, Westerman, Hattori, McLeland, and Naughton

[57] ABSTRACT

A high-frequency filter having series and parallel electrode patterns formed on a mount substrate, surface acoustic wave resonators connected to a signal input/output line of the electrode patterns in series, and coaxial dielectric resonators having respective one input/output terminals connected to the signal input/output line and the other input/output terminals connected to a ground element. In such a composite high-frequency filter, the surface acoustic wave resonators form the resonators in the serial arms while the coaxial dielectric resonators form resonators in the parallel arms. The high-frequency filter can meet all the requirements of enhanced miniaturization, selectivity and power handling.

6 Claims, 8 Drawing Sheets

HIGH FREQUENCY FILTER INCLUDING
BOTH DIELECTRIC AND SURFACE
ACOUSTIC WAVE RESONATORS

This application is a continuation of application Ser. No. 08/626-909 filed Apr. 4, 1996, now abandoned; which is a continuation of application Ser. No. 08/357,205 filed Dec. 13, 1994, now abandoned.

BACKGROUND OF THE INVENTION

1. Field of the Invention

The present invention relates to a high-frequency filter used, for example, in portable communication equipment.

2. Description of the Related Art

There is an ever-increasing need for more compact and reliable portable communication equipment, including a hand-held cellular telephone and a car cellular. Thus, it is desirable that a high-frequency filter used in such equipment is more miniaturized, selective and power resistant.

Conventionally well-known high-frequency filters include one employing a dielectric resonator (see Japanese Unexamined Patent Publication No. 110501/1992) and one employing a surface acoustic wave resonator (see Japanese Unexamined Patent Publication No. 260911/1989).

Figure 7:
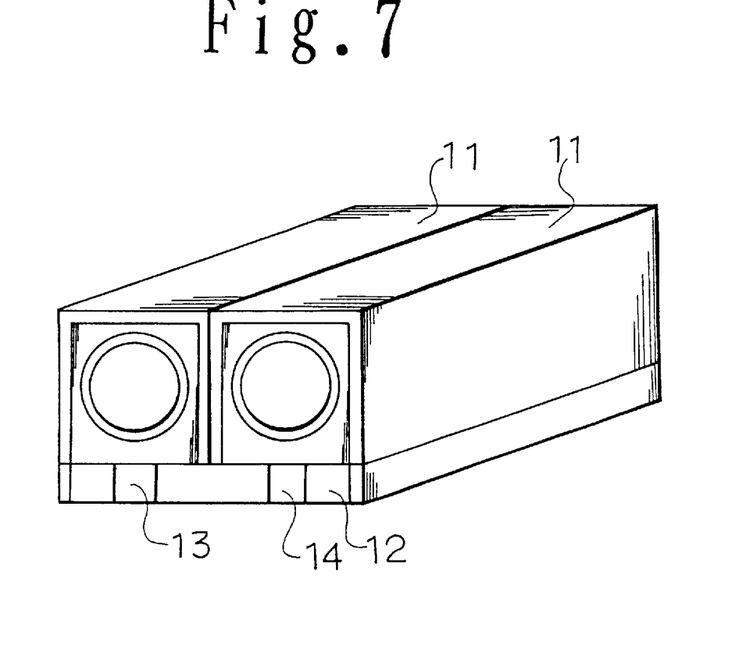
FIG. 7 is a perspective view showing a dielectric filter.

FIG. 7 is a perspective view showing the high-frequency filter employing a dielectric resonator (hereinafter referred to as 'dielectric filter'). The dielectric filter is configured with two dielectric resonators 11 mounted on an alumina substrate 12. The dielectric filter is also provided with input/output electrodes 13 and 14 on a side of the alumina substrate 12 to receive or output a high-frequency signal.

Figure 8:
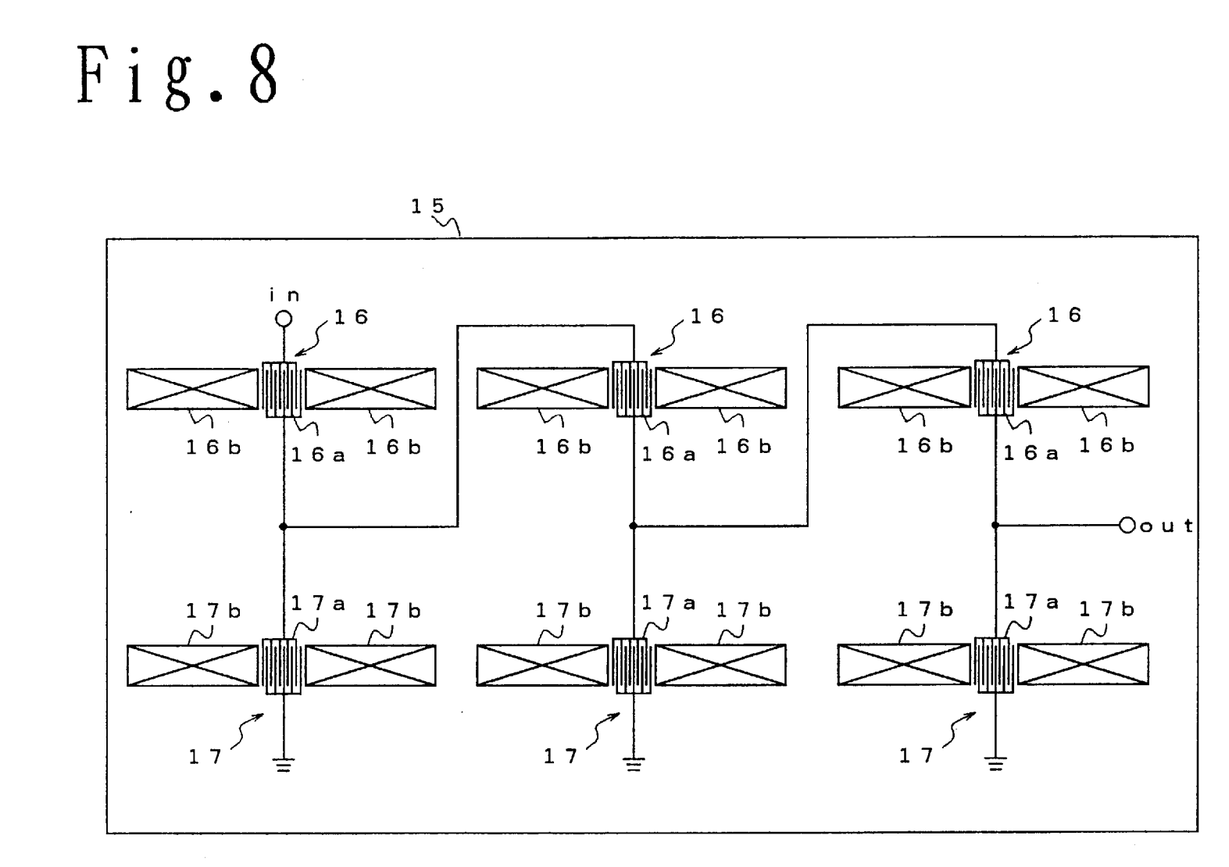
FIG. 8 is a schematic plan view showing a composite high-frequency filter employing a surface acoustic wave resonator (surface acoustic wave filter)
Figure 9:
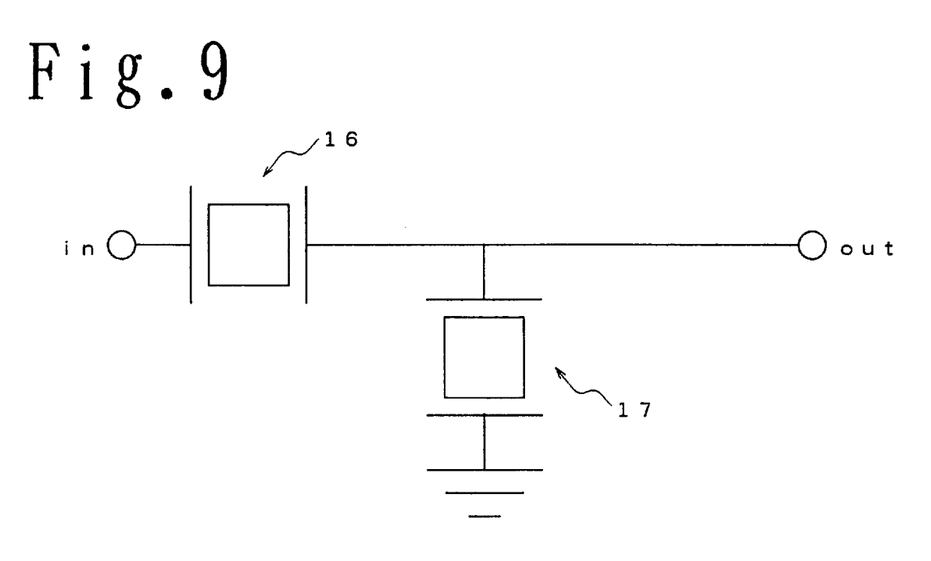
FIG. 9 is a circuit diagram showing a unit of filter function in the surface acoustic wave filter.

FIG. 8 is a schematic plan view showing a composite high-frequency filter employing a surface acoustic wave resonator (hereinafter referred to as 'surface acoustic wave filter'). FIG. 9 is a circuit diagram showing a unit of filter function in the surface acoustic wave filter.

The surface acoustic wave filter has serial surface acoustic wave resonators 16 and parallel surface acoustic wave resonators 17 different in resonance frequency from each other arranged on a piezoelectric substrate 15 and electrically connected to each other, and it utilizes a difference in impedance for the frequency between the serial surface acoustic wave resonators 16 and the parallel surface acoustic wave resonators 17 to implement a bandpass filter. The surface acoustic wave resonators 16 and 17 have their respective IDTs (inter digital transducers) 16a and 17a and pairs of reflector elements 16b and 17b on opposite sides of each of the IDTs.

Figure 5:
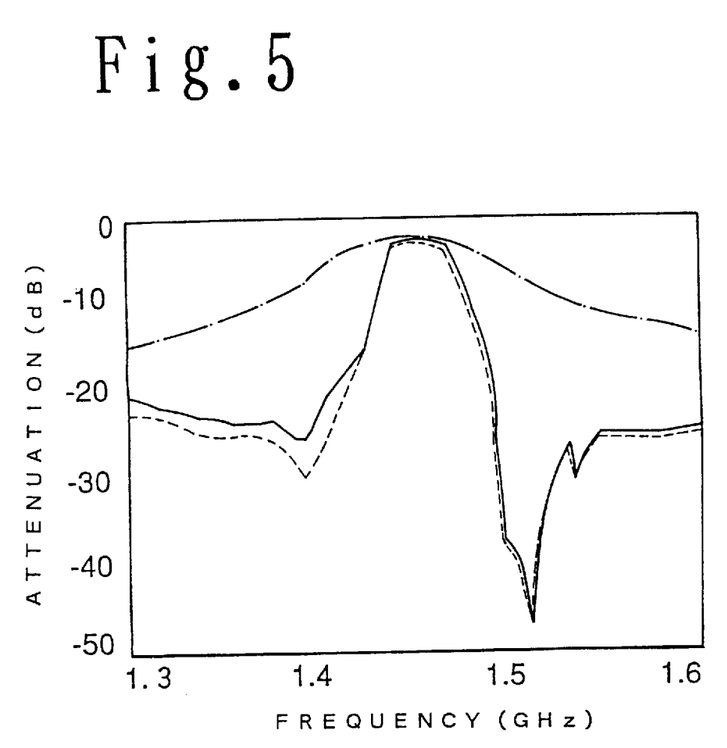
FIG. 5 is a graph illustrating frequency characteristics of a transmission rate in the high-frequency filter of the present invention and the prior art high-frequency filter.

The dielectric filter suffers from degraded selectivity due to its frequency characteristic of a transmission rate as represented by a dot-and-dash line in FIG. 5. This is generally caused by miniaturization of the dielectric resonator. Specifically, there is a relation between a resonance sharpness (Q-value) of the dielectric resonator and its shape that the smaller the shape is the lower the selectivity becomes, and thus, the shape must be enlarged in order to enhance the selectivity.

Components used in a cellular telephone are about 1 to 4 mm in thickness, and a dielectric filter of such thickness attains a resonance sharpness of about several hundreds. However, the dielectric filter is excellent in power handling and is characterized in that its filter characteristic is hardly influenced by power on the order of several watts.

The surface acoustic wave filter has a frequency characteristic of a transmission rate as represented by broken line in FIG. 5, and thus it is excellent in selectivity; that is, it has increased resonance sharpness and can be made smaller than the dielectric filter.

However, the surface acoustic wave filter suffers from degraded power handling. Specifically, charged with high power, the surface acoustic wave filter has its IDTs greatly oscillated to be broken down, and in addition to that, it may also be broken down by heat generated by electric resistance because fine electrodes are supplied with the high power.

The above-mentioned composite surface acoustic wave filter tends to fade within several minutes with power input as high as 5 W. This is because the IDTs deteriorate due to migration. Since the frequency at which high power is applied is within a range of passband, the resonators in the serial arms are in a resonance state (serial resonance) while the resonators in an the parallel arms are in anti-resonance state (parallel resonance).

This means that the resonators in the serial arms enter an ON state while the resonators in the parallel arms enter an OFF state. In such a situation, voltage applied to the IDTs 16a in the resonators in the serial arms approaches zero while voltage applied to the IDTs 17a in the resonators in the parallel arms reaches a peak. Consequently, the resonators in the parallel arms become greater in migration, and therefore, lower power causes the resonators in the parallel arms to be broken down.

As has been recognized, the dielectric filter and the surface acoustic wave filter are advantageous in one point and disadvantageous in the other point in contradiction to each other, and both the filters cannot meet all the requirements of further miniaturization, selectivity and power resistance.

Accordingly, it is an object of the present invention to provide a high-frequency filter capable of meeting all the requirements of miniaturization, high selectivity and high power handling.

The high-frequency filter of the present invention has one or more units of filter function each of which includes a resonator in the serial arms having its input/output terminals connected to a signal line in series and a resonator in the parallel arms having its one input/output terminal connected to the signal line and the other input/output terminal grounded. The resonator in the serial arms is formed by a surface acoustic wave resonator while the resonator in the parallel arms is formed by a dielectric resonator.

Such a high-frequency filter functions in a manner similar to the prior art composite high-frequency filter formed by the surface acoustic wave resonators alone while revealing a filter characteristic of its own.

If the resonance point of the resonator in the serial arms and the anti-resonance point of the resonator in the parallel arms coincide with each other, signals are passed in the vicinity of the frequency because the resonator in the serial arms enters an ON state while the resonator in the parallel arms enters an OFF state. On the other hand, the resonator in the serial arms enters an OFF state at the anti-resonance point, and therefore, an attenuation pole arises on the side of frequencies higher than those in the passband. In addition, the resonator in the parallel arms enters an ON state at the resonance point, and therefore, an attenuation pole arises even on the side of frequencies lower than those in the passband.

Frequency at which high power is applied is generally within a range of the passband, and voltage applied to an IDT (inter digital transducer) in the surface acoustic wave resonator goes down to bottom because the resonator in the serial arms enters an ON state in the passband. Since the surface acoustic wave resonator is used as the resonator in the serial arms, there is an extremely small possibility that the surface acoustic wave resonator is broken down.

The dielectric resonator of the resonator in the parallel arms enters an OFF state in the same situation, high voltage is applied thereto. However, the dielectric resonator is so excellent in power resistance that the resonator in the parallel arms is not broken down. Thus, its power resistance is greatly enhanced, compared with a case where both the resonator in the serial arms and the resonator in the parallel arms are the surface acoustic wave resonator.

Moreover, the surface acoustic wave resonator employed as the resonator in the parallel arms can have selectivity as high as the prior art surface acoustic wave resonator composite filter.

U.S. Pat. No. 5,254,962 discloses a combined acoustic wave device and ceramic block filter structure. A surface acoustic wave device, as well as other electronic device, can be mounted into the sides of ceramic blocks that comprise a ceramic block filter device. The surface acoustic wave device as mounted in the filter block does not require or displace volume that would be required to mount the surface acoustic wave devices in their own housings.

In the above structure, however, acoustic wave device is incorporated in the ceramic blocks that comprise the ceramic block filter device to reduce the whole volume, and the ceramic block filter device or the acoustic wave device does not constitute the resonator in the serial arms or parallel arms.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
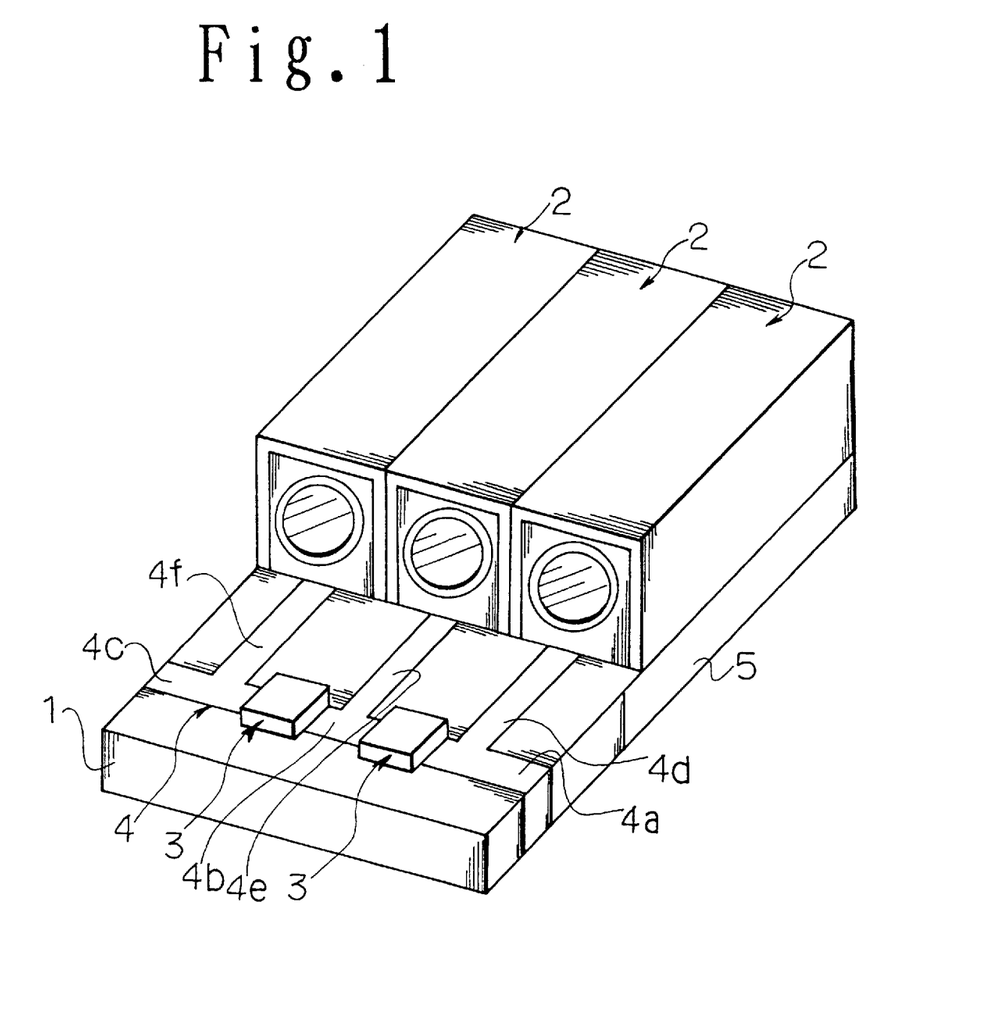
FIG. 1 is a perspective view showing a high-frequency filter according to the present invention.

As shown in FIG. 1, a high-frequency filter of the present invention includes a mount substrate 1, three coaxial dielectric resonators 2 and two surface acoustic wave resonators 3. The surface acoustic wave resonators 3 form the resonators in the serial arms and are connected to a signal input/output line 4 in series. The coaxial dielectric resonators 2 form the resonators in the parallel arms and respectively have one of input/output terminals (electrode patterns 4d to 4f mentioned later) connected to the signal input/output line 4 and the other (short-circuit electrodes mentioned later) connected to a ground element 5.

The high-frequency filter is sized in 6.0×7.5×3.1 mm (0.14 cc) and is almost the same in volume as the prior art dielectric filter.

Figure 2:
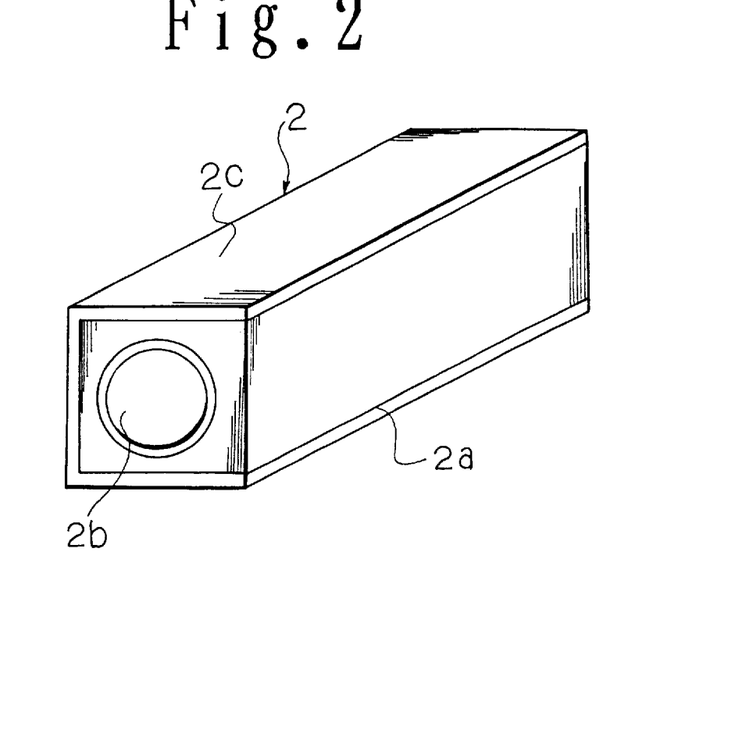
FIG. 2 is a perspective view showing a coaxial dielectric resonator.

FIG. 2 is a perspective view showing the coaxial dielectric resonator 2. The coaxial dielectric resonator 2 is preferably shaped as a rectangular parallelopiped about 2.5 mm long by about 2.5 mm wide by 5.0 mm thick. A dielectric block 2a forming the coaxial dielectric resonator 2 is preferably composed of, for example, ceramics of a $Li_2O$—CaO—SrO—$Sm_2O_3$—$TiO_2$ system (dielectric constant $\epsilon r=110$).

The dielectric block 2a has a through hole of 0.8 mm diameter provided in the longitudinal direction in its central part. An inner peripheral surface of the through hole is coated with an inner conductive member 2b by means of electroless copper plating while an outer peripheral surface of the dielectric block 2a is similarly coated with an outer conductive member 2c by means of electroless copper plating.

One of two end faces perpendicular to the through hole (front face in FIG. 2) is opened while the other end face is short-circuited. specifically, a short-circuit electrode is formed on the rear surface (hidden face and not shown) of the dielectric block 2a to short-circuit the coaxial resonator 2.

Figure 3:
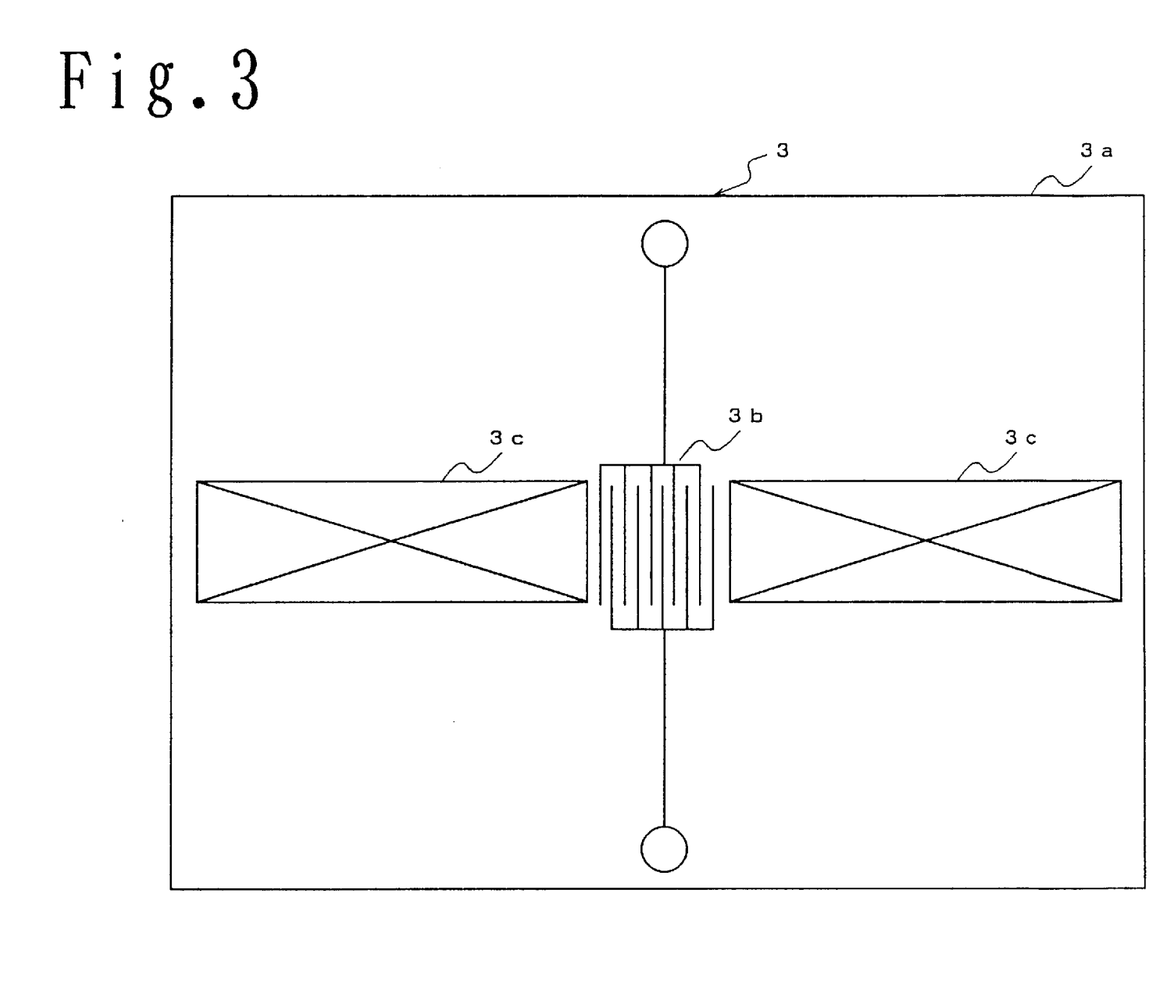
FIG. 3 is a schematic plan view showing a surface acoustic wave resonator.

FIG. 3 is a schematic plan view showing the surface acoustic wave resonator 3. The surface acoustic wave resonator 3 has a piezoelectric substrate 3a made of $LiNbO_3$, an IDT (inter digital transducer) 3b on the same, and a pair of reflectors 3c on opposite sides of the IDT. The IDT 3b is of 0.7 $\mu$m electrode finger width, 1.4 $\mu$m electrode finger cycle and 40 $\mu$m electrode finger length, and there are 180 electrode fingers. In the reflector 3c, there are 300 reflector elements.

Figure 4:
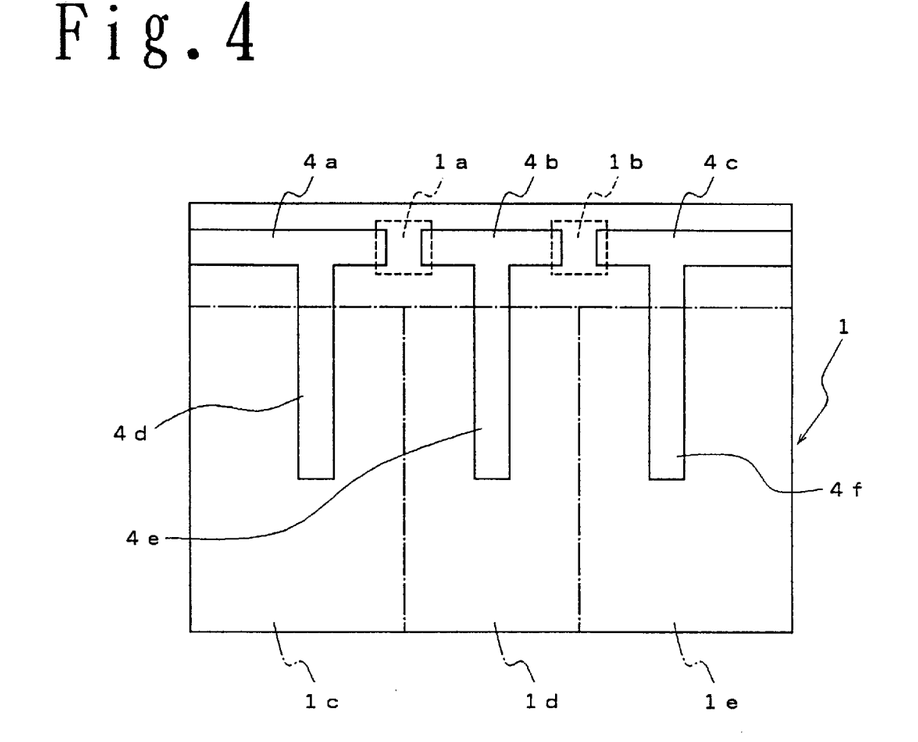
FIG. 4 is a plan view showing a mount substrate.

FIG. 4 is a plan view showing the mount substrate 1. The mount substrate 1 is formed of alumina substrate of 0.635 mm thickness. On the mount substrate 1, the electrode patterns 4a, 4b and 4c working as the signal input/output line 4 are formed. Since the surface acoustic wave resonators 3 are respectively to be placed between the electrodes patterns 4a and 4b and between the electrodes patterns 4b and 4c, there lie regions 1a and 1b in corresponding areas. Furthermore, electrode patterns 4d, 4e and 4f are formed, respectively expanding from the electrode patterns 4a, 4b and 4c toward regions 1c, 1d and 1e where the coaxial dielectric resonators 2 are to be placed.

As can be seen from FIG. 4, the electrode patterns are arranged in three T-shapes; that is, the electrode patterns 4a and 4d, 4b and 4e, and 4c and 4f are respectively mated in T-shaped patterns.

These T-shaped patterns are arranged side-by-side and the surface acoustic wave resonators 3 are placed in the regions 1a and 1b between adjacent lateral bars of the T-shapes (between the electrode patterns 4a and 4b, and 4b and 4c). Longitudinal bars of the T-shaped patterns (electrode patterns 4d, 4e and 4f) are arranged for capacity coupling with the coaxial dielectric resonators 2. The surface acoustic wave resonators 3 are soldered to conductive material while the coaxial dielectric resonators 2 are coupled by insulating adhesive.

The lateral bars of the T-shaped patterns at opposite ends (electrode patterns 4a and 4c) on the mount substrate 1 have their respective one ends expanded to the sides of the mount substrate 1. The ground element 5 is formed on the opposite sides of the mount substrate 1.

As previously mentioned, coupling the coaxial dielectric resonators 2 by the insulating adhesive permits capacitance to be generated between the inner conductive members 2b of the coaxial dielectric resonators 2 and the electrode patterns 4d, 4e and 4f, respectively, the coaxial dielectric resonators 2 have a double resonance characteristic where the resonance frequency (serial resonance frequency) is slightly lower than the anti-resonance frequency (parallel resonance frequency), similar to the surface acoustic wave resonators 3.

The resonance point of surface acoustic wave resonator 3 forming the resonators in the serial arms and the anti-resonance point of the coaxial dielectric resonator 2 forming the resonator in the parallel arms coincide with each other, and therefore, signals are passed in the vicinity of the frequency because the surface acoustic wave resonator 3 enters an ON state while the coaxial dielectric resonator 2 enters an OFF state. On the other hand, since the surface acoustic wave resonator 3 enters an OFF state at the anti-resonance point, an attenuation pole arises on the side of frequencies higher than those in the passband. In addition, the coaxial dielectric resonator 2 enters an ON state at the resonance point, and therefore, an attenuation pole arises even on the side of frequencies lower than those in the passband.

The frequency at which high power is applied is generally within a range of the passband, and voltage applied to the IDT 3b in the surface acoustic wave resonator 3 goes down to a minimum because the surface acoustic wave resonator 3 enters an ON state in the passband. Since the surface acoustic wave resonator 3 is used as the resonator in the serial arms, there is an extremely small possibility that the surface acoustic wave resonator 3 is broken down. Although high voltage is applied to the coaxial dielectric resonator 2 since it enters an OFF state in the same situation, the coaxial dielectric resonator 2 is so excellent in power handling that it is not broken down.

Figure 6:
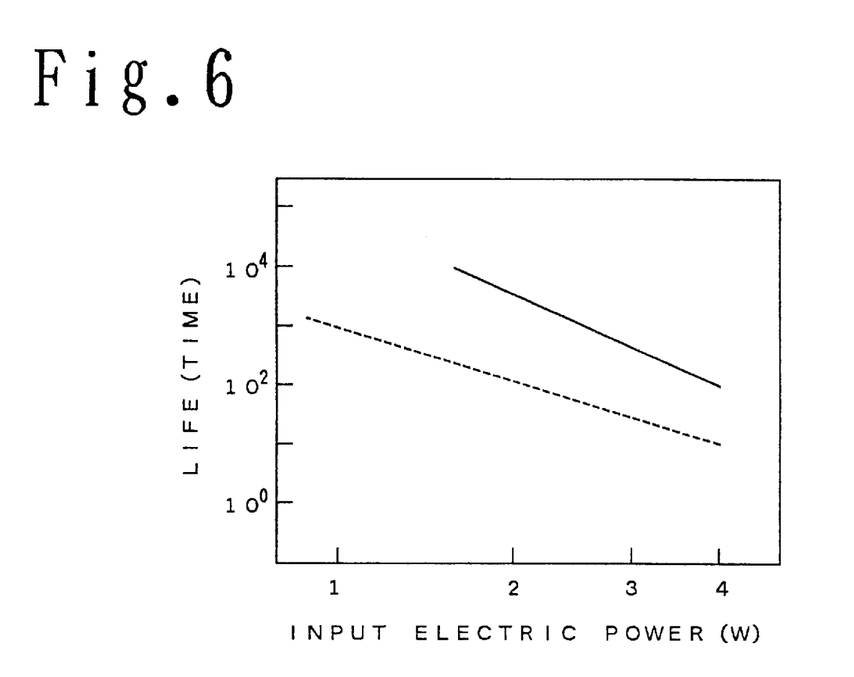
FIG. 6 is a graph illustrating a relation of supplied power with lifetime in the high-frequency filter of the present invention and the prior art surface acoustic wave high-frequency filter.

FIG. 6 is a graph illustrating a relation between supplied power and lifetime, wherein the lifetime of the prior art surface acoustic wave resonator composite filter is represented by broken line while the lifetime of the high-frequency filter of the present invention is represented by solid line. As will be recognized from the graph, enhancement of power handling is accompanied with about a magnitude or more extension of the lifetime.

Additionally, since the surface acoustic wave resonator 2 forming the resonator in the serial arms is used, the high-frequency filter, as represented by solid line in FIG. 5, has selectivity as high as the prior art surface acoustic wave resonator composite filter (broken line).

Thus, in accordance with the present invention, the high-frequency filter of the present invention can meet all the requirements of enhanced miniaturization, selectivity and power handling.

Furthermore, since the surface acoustic wave resonators 3 and the coaxial dielectric resonators 2 are arranged on the same mount substrate 1, the high-frequency filter can be increasingly miniaturized, compared with a case where these components are arranged in separate substrates.

The surface acoustic wave resonators 3 and the coaxial dielectric resonators 2 are connected by the electrode patterns 4a to 4f formed on the mount substrate 1, and this facilitates fabrication, compared with a case connection of these components are attained by wiring or other means.

Also, the electrode patterns 4a to 4f arranged as shown in FIG. 4 bring about an optimum layout of the resonators 2 and 3, and thus, an area of the mount substrate 1 can be reduced to increasingly miniaturize the high-frequency filter.

The lateral bars of the T-shaped patterns at opposite ends on the mount substrate 1 (electrode patterns 4a and 4c) have respective one ends expanded to the sides of the mount substrate 1, and this facilitates electrical connection of other circuits to the sides by soldering or other means. The similar effect can be further attained because the ground element 5 is formed on the sides of the mount substrate 1.

Although the present invention has been described and illustrated in detail, it is clearly understood that the same is by way of illustration and example only and is not to be taken by way of limitation, the spirit and scope of the preset invention being limited only by the terms of the appended claims.

What is claimed is:

1. A high-frequency filter comprising:
   a plurality of surface acoustic wave resonators, each having two input/output terminals connected to a signal line, all of the plurality of resonators connected in series with one another and with said signal line; and
   at least one dielectric resonator having one of its input/output terminals connected to the signal line and the other connected to a ground element.

2. A high-frequency filter according to claim 1, wherein said surface acoustic wave resonator and said dielectric resonator are arranged on a single mount substrate.

3. A high-frequency filter according to claim 2, wherein said plurality of surface acoustic wave resonators and said dielectric resonator are connected by an electrode pattern formed on the mount substrate, said electrode pattern including at least one parallel arm connected to said one of the input/output terminals of said dielectric resonators.

4. A high-frequency filter comprising one or more units each having a filter function, each of which is comprised of a at least one surface acoustic wave resonator in serial electrode arms, each said surface acoustic wave resonator having input/output terminals connected to a signal line in series and at least one dielectric resonator located in a parallel electrode arm, said dielectric resonator having one input/output terminal connected to the signal line and the other input/output terminal connected to a ground element; the surface acoustic wave resonator and the dielectric resonator being arranged on a single mount substrate; the surface acoustic wave resonator and the dielectric resonator being connected by an electrode pattern formed on the mount substrate; the electrode pattern having a plurality of T-shaped patterns arranged side-by-side; the surface acoustic wave resonator being located between lateral bars of adjacent ones of the T-shaped patterns so that it is electrically connected to the lateral bars; and the dielectric resonator being located for capacity coupling with any of longitudinal bars of the T-shaped patterns.

5. A high-frequency filter according to claim 4, wherein said lateral bars of the T-shaped patterns on opposite ends of said mount substrate have respective one ends expanded to sides of said mount substrate.

6. A high-frequency filter according to claim 4, wherein said ground element is formed on sides of said mount substrate.

* * * * *